US006570927B1

(12) United States Patent
Van Stralen et al.

(10) Patent No.: US 6,570,927 B1
(45) Date of Patent: May 27, 2003

(54) METHOD FOR TAIL-BITING AND DECODING RECURSIVE SYSTEMATIC CODES

(75) Inventors: Nick Andrew Van Stralen, Clifton Park, NY (US); John Anderson Fergus Ross, Saratoga Springs, NY (US); John Bailey Anderson, Lund (SE)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 09/340,101

(22) Filed: Jun. 25, 1999

Related U.S. Application Data

(60) Provisional application No. 60/101,649, filed on Sep. 24, 1998.

(51) Int. Cl.$^7$ .............................................. H04B 14/04
(52) U.S. Cl. ....................... 375/242; 375/265; 375/295; 375/340
(58) Field of Search ................................. 375/295, 292, 375/265, 242, 340; 341/81, 143; 714/755, 786, 791, 792, 794, 795, 800, 801

(56) References Cited

U.S. PATENT DOCUMENTS

| 5,970,098 A | * 10/1999 | Herzberg ..................... 375/264 |
| 5,996,104 A | * 11/1999 | Herzberg ..................... 714/755 |
| 6,263,467 B1 | * 7/2001 | Hladik et al. ................ 714/755 |
| 6,323,788 B1 | * 11/2001 | Kim et al. ...................... 341/81 |

OTHER PUBLICATIONS

"Channel Decoding Short Frames of Voice Data", Ross et al. pp. 251–258 of vol. 1, Proceedings of Wireless 98—10th Annual Conference on Wireless Communications, Jul. 6–8, 1998.

* cited by examiner

Primary Examiner—Shuwang Liu
(74) Attorney, Agent, or Firm—Duane Morris LLP

(57) ABSTRACT

A method is described for convolutionally encoding and decoding data (voice coded data), organized into (35-bit, 20 msec) frames, where the data is encoded by a finite-state data encoder (RSC coder 216) for transmission over a data channel (18). The RSC encoder avoids the need for termination bits associated with each N-bit frame of data, so that the number of bits associated with each encoded frame is reduced, and the throughput of the channel can be increased. The method according to the invention includes storing the first M bits of each frame. Once they are stored, they are loaded in parallel into the M stages of the encoder, thereby deleting residual states from the preceding frame. The remaining (N–M) bits are then applied to the encoder, causing it to produce the convolutional code. After the last of the (N–M) bits are encoded, the M stored bits are summed with feedback from the encoder, and reapplied to the encoder. The ending state of the encoder is thus equal to the starting state.

4 Claims, 5 Drawing Sheets

METHOD FOR TAIL-BITING AND DECODING RECURSIVE SYSTEMATIC CODES

This application claims priority of Provisional patent application Ser. No. 60/101,649, filed Sep. 24, 1998.

FIELD OF THE INVENTION

This invention relates to communication systems, and more specifically to communication systems in which the data is encoded.

BACKGROUND OF THE INVENTION

Communications systems have become ubiquitous, and their capabilities increase daily. A major problem with communications systems is that the bandwidth of the channels available in certain locations is limited, and the projected usage is great. This is particularly true in the case of spacecraft-based communications systems, because they provide what may be the only service to certain regions of the world.

Unfortunately, communications systems are subject to noise, which tends to destroy some of the data bits, or at least makes their decoding subject to errors. For a given channel bandwidth and power, there is compromise between bits which are used for transmitting data and bits which are used for error detection andor correction. The addition of more information bits per unit time necessarily decreases the number of error detection and correction bits which can be transmitted with the data bits, so as the data throughput increases, the error rate also increases.

Channel coding is useful for attaining reliable voice communication in low-received-power environments, such as portable satellite communications transceivers. In general, error control coding reduces the number of data bits which can be transmitted, and so tends to degrade the underlying uncorrected transmission. Thus, there is a fundamental tradeoff between the number of bits allocated to data and the number allocated to error control coding when the data rate of the channel is the limiting factor. Increasing the number of data bits decreases the number of error control code bits, and the channel transmission will be more natural, but more subject to errors due to channel noise. On the other hand, if the number of data bits is too much reduced, and the error control bits increased, the channel transmission will be more reliable, but the data throughput will be reduced.

Convolutional codes are an effective method for protecting communications in noisy channels. In framed systems, convolutional codewords must be terminated to preserve the distance structure of the word near the end of a frame. This requirement requires the addition of M extra "tail" bits to the end of a frame, where M is the number of bits in the encoder memory. In a short-burst or short-frame application such as speech transmission, the tail bits consume a significant fraction of the encoded channel bits, which might otherwise be usable to improve the speech quality.

Improved channel performance is desired.

SUMMARY OF THE INVENTION

A method according to an aspect of the invention generates a code word of a recursive systematic code in a $2^M$ state M-register encoder from source information organized into N-bit frames. The encoder includes a common input-output port, at least a second output port, and multistage feedback. The method includes the step of storing the first M bits of each frame of the source information, to thereby produce M stored bits. The M stored bits are loaded into corresponding registers of the encoder. The remaining (N−M) bits of each of the frames are encoded by applying the (N−M) bits to the common input-output port of the encoder. As a result, or whereby, the encoder changes state with each succeeding bit applied to the common input-output port, systematically encoded information appears at the common input-output port of the encoder, and parity bits appear at the second port of the encoder. Following the step of encoding the remaining (N−M) bits, the M stored bits are summed with a feedback signal to generate an M-bit intermediate signal, and the intermediate signal is applied to the common input-output port in such a manner that the state of the encoder at the termination of encoding each frame is the same as the state of the encoder after the step of loading.

In one mode of the method of the invention, the encoder is a feedback rate ½ encoder. In another mode, the encoder is a feedback rate ⅓ encoder, and the encoder also includes a third output port.

DESCRIPTION OF THE INVENTION

Figure 1:
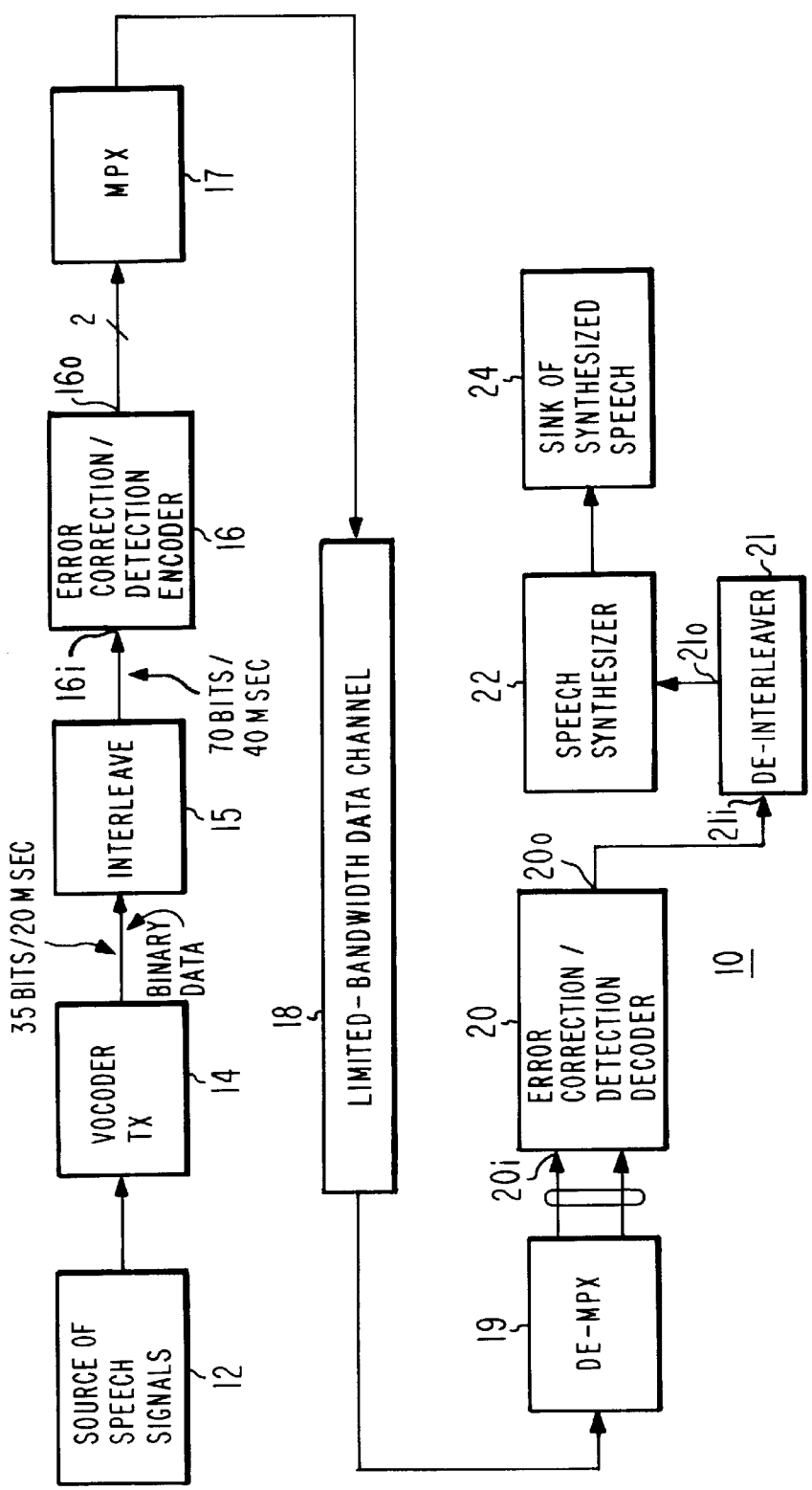
FIG. 1 is a simplified block diagram of a vocoder system which uses a data communication system according to an aspect of the invention.

In FIG. 1, a vocoder system 10 includes a block 12, which represents a source of speech signals, such as a microphone, recording, or the like. The speech signals are applied to a vocoder transmitter block 14, which converts the speech signals into digital bits with some encoding for reducing the bit rate. Some vocoders encode characteristics of the speech signals, such as spectrum, pitch period (pitch), voicing, and gain. The digital bits representing the characteristics of the speech represent the input signals to the digital channel in which the invention resides. The vocoder transmitter 14 produces its signals in 35-bit, 20 millisecond (msec) frames. Representative vocoder arrangements include those described in U.S. Pat. No. 6,081,776, issued Jun. 20, 2000 in the name of Grabb et al.; U.S. Pat. No. 6,078,880, issued Jun. 20, 2000 in the name of Zinser et al.,; U.S. Pat. No. 6,138,092, issued Oct. 24, 2000 in the name of Zinser et al.; U.S. Pat. No. 6,067,511, issued May 23, 2000 in the name of Grabb et al.; U.S. Pat. No. 6,119,082, issued Sep. 12, 2000 in the name of Zinser et al.; U.S. Pat. No. 6,098,036, issued Aug. 1, 2000, in the name of Zinser et al.; and U.S. Pat. No. 6,094,629, issued Jul. 25, 2000 in the name of Grabb et al.

Evaluations have been performed on the output of the vocoder for many different vocoder configurations. These evaluations determined the probability of the occurrence of each of the bits of a 35-bit frame for many different speakers, and for many different sentences or types of message. In addition, the evaluations determined, for each bit, the likelihood that, if the bit has a value, that the succeeding bit has the same value. These evaluations produced data which, for any particular vocoder transmitter, can be tabulated in the form of joint vocoder statistics.

The digital bits or binary data organized in 35-bit, 20 msec frames are applied from vocoder transmitter block 14 of FIG. 1 to the input port of an interleaver 15, which takes or accepts one 20 msec frame, and outputs one 35-bit, 20 msec frame, with the bits organized in some particular or specified fashion, as for example by writing in sequence into rows and columns, and reading in sequence from columns and rows, which tends to "scramble" the bit locations. In an actual embodiment, the interleaving pattern is determined by a table which gives the effect of a random interleaving, for better performance. In a particular version, the table is arranged to de-cluster the bits which tend to be biased (to have a high probability of being either a zero or a one) when analyzed at the output of a particular vocoder. The output of interleaver 15 is in the form of 35-bit, 20 msec frames.

The 35-bit, 20 msec frames from interleaver 15 are applied to an input port 16$i$ of a block 16, which represents an error correction encoder. Encoder 16 introduces redundancy into the data stream, so that redundant portions of the signals at the receiver can be compared with each other to detect possible errors. One type of such encoding which may be used is a binary recursive systematic convolutional code, well known in the art. The error correction encoded data stream at the output port 16$o$ of block 16 in one particular embodiment of the invention receives the 35-bit, 20 msec frames, and operates on them as though they were grouped into 70-bit, 40 msec frames. It should be noted that the two 20 msec frames which are inherently included within each 70-msec frame tend to be correlated with each other, because they are generated from closely adjacent portions of the source speech. For each 70-bit, 40 msec superframe of binary data input, the encoder 16 produces 120-bit frames, thus adding 50 parity bits per frame to the systematic bits. In a particular embodiment of the error correction/detection encoder 16, the parity bits and systematic bits are produced on separate output signal paths of output port 16$o$. A multiplexer 17 combines the parity bits and the systematic bits into frames of digital bits.

The redundancy-encoded digital signals are applied from the output port of block 17 of FIG. 1 to a limited-bandwidth channel, which is represented as a block 18. Channel 18 may include analog processing, such as upconversion, amplification, filtering, conversion or transduction by antennas to electromagnetic radiation such as light or RF, reception by other antennas, downconversion. further amplification, and the like. Many of these steps tend to associate the analog signals with noise, so that the data bits as they appear at the end of channel 18 are noisy.

The noisy data bits are coupled from the receiving end of channel 18 to a block 19, which is a demultiplexer, which undoes the multiplexing performed by multiplexer block 17, and applies the demultiplexed systematic and parity bits over separate paths to a block 20, which represents an error correction detection/decoder. This detection/decoder compares redundant components of the data stream which were originally introduced by encoder 16, and generates estimates of the data bits which were originally applied to the encoder 16. In effect, detection/decoder 20 performs the inverse of the operation which was performed by encoder 16. As described below, the estimates for each data bit are in the form of probabilities, and detection/decoder 20 also provides an indication, for each frame of decoded data, of the likelihood of an error in one or more decoded bits of the frame.

The decoded data from output port 20$o$ of block 20 is applied to the input port 21$i$ of a block 21, which is a de-interleaver. De-interleaver 21 reverses the operation of interleaver 15, using a reverse table. The de-interleaved information is applied from block 21 to a block 22, which represents a speech synthesizer, which operates on the data bits representing the speech signal characteristics, and synthesizes what is hoped to be an acceptable replica of the original speech signal. According to an aspect of the invention, the speech synthesizer provides concealment for those frames of decoded data from block 20 which are flagged as being likely to be in error. The synthesized speech signal at the output of synthesizer 22 is applied to a sink of speech signals or a utilization means represented by a block 24, which may be as simple a device as a loudspeaker or headphones.

Figure 2:
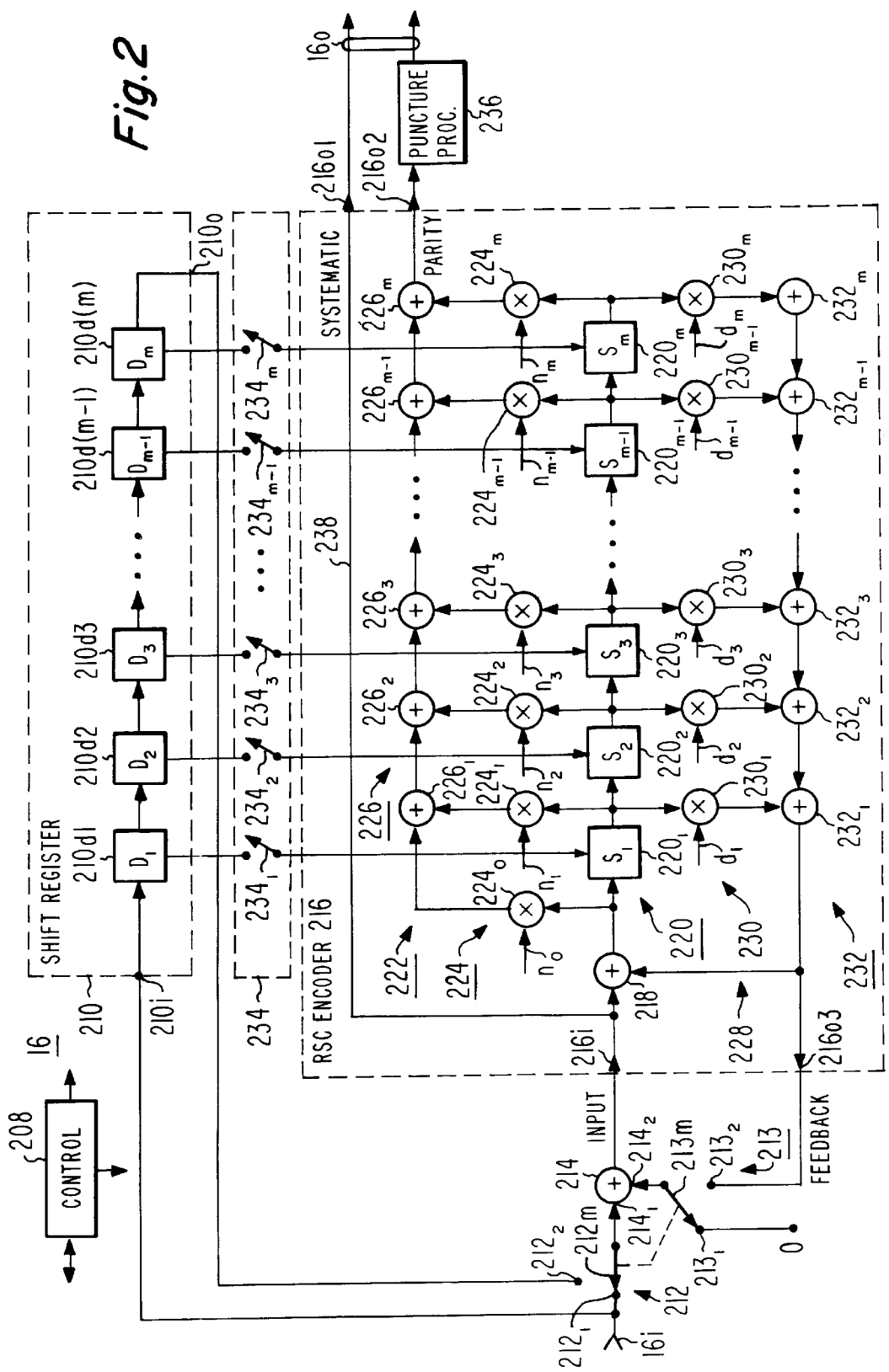
FIG. 2 is a simplified block diagram of the error correction/detection encoder portion of the system of FIG. 1.

FIG. 2 illustrates details of error correction/detection encoder 16 of FIG. 1. In FIG. 2, the digital signals representing the various quantized speech characteristics are applied by way of input port 16$i$ to a shift register 210 and, by way of a single-pole, double throw switch or relay, illustrated by a mechanical switch symbol 212, and a summing block 214, to a block 216, which represents an RSC encoder. Switch 212 includes a "movable" common element 212$m$, which is capable of making contact with separate switch terminals $212_1$ or $212_2$. A second switch 213, illustrated by a mechanical switch symbol, has its movable element 213$m$ connected to second input port 214$i$2 of summing circuit 214, and is ganged for simultaneous operation with movable element 212$m$ of switch 212. Element 213$m$ is capable of contacting terminals $213_1$ or $213_2$. In the illustrated positions of ganged switch elements 212$m$ and 213$m$, element 212$m$ contacts terminal $212_1$, and element 213$m$ contacts terminal $213_1$. Terminal $213_1$ is connected to a source of a logic low or logic "0." The illustrated position of switches 212 and 213 is that which is used in the "normal" or "systematic" mode of operation of the correction/detection encoder 16 of FIG. 2.

In FIG. 2, the digital signals representing the various quantized speech characteristics are coupled from input port 16$i$ to an input port 210$i$ of a shift register 210. Shift register 210 includes a plurality of cascaded delay stages $210_1$, $210_2$, $210_3$, . . . , $210_{m-1}$, $210_m$. In a particular embodiment of the invention, m=8. The clocking of the delay stages $210_1$, $210_2$, $210_3$, . . . , $210_{m-1}$, $210_m$ is under the control of a controller illustrated as 208, the operation of which is explained in more detail below.

The movable element 212$m$ of switch 212 of FIG. 2 is connected to an input port of a summing circuit or block 214, which also receives a feedback input signal from terminal $213_2$ when movable element 213$m$ of switch 213 makes contact with terminal $213_2$, but which does not receive a feedback signal, or which, equivalently, receives a "0" feedback signal, in the illustrated position of movable element 213$m$. The summed signal produced by summing circuit 214 is equal to the input signal from switch 212 when switch 213 is in the illustrated position and no feedback is applied to the second input port of summing circuit 214, and is equal to the sum of the input signal from switch 212 plus the feedback signal when switch 213 is in its alternate position (not illustrated). The sum signal produced by summing circuit 214 is applied to an input port 216$i$ of a recursive systematic code (RSC) encoder 216. Signals applied to input port 216$i$ are (a) coupled by a path 238 directly to output port 216$o$1 of RSC encoder 216, and (b) coupled through an adder, summing circuit or modulo-two summer 218 to a cascade of registers designated generally as 220, which includes stages $220_1$, $220_2$, $220_3$, . . . , $220_{m-1}$, $220_m$. In a particular embodiment of the invention, there are eight stages of registers in register set 220, corresponding to the number of delay stages in shift register 210. A modulo-two summer counts to a maximum value of one, and resets to zero at the next incremental unit input; the count of a modulo-two counter in response to successive additions of unit value is a sequence of 0, 1, 0, 1, 0, 1, 0, . . .

The cascade of registers 220 of FIG. 2 has both feedforward and feedback signal paths, designated generally as 222 and 228, respectively. The feedforward signal paths 222 include a set 224 of two-input-port multipliers, including multiplier $224_0$ coupled to the output port (also known simply as the "output") of modulo-two summer 218, multiplier $224_1$ coupled to the output of register $220_1$, multiplier $224_2$ coupled to the output of register $220_2$, multiplier $224_3$ coupled to the output of register $220_3$, . . . , multiplier $224_{m-1}$ coupled to the output of register $220_{m-1}$, and multiplier $224_m$ coupled to the output of register $220_m$. Each multiplier $224_0$ through $224_m$ receives a code bit at its second input port, which is part of a code word "n" which determines the encoding. In FIG. 2, the code word n includes bits designated $n_0, n_1, n_2, n_3, \ldots, n_{m-1}$, and $n_m$. The output ports of multipliers $224_0$ and $224_1$ of feedforward paths 222 are applied to the input ports of a modulo-two summer or summing circuit $226_1$ of adder set 226, and the summed output signal is applied to an input port of modulo-two summer $226_2$. The output of multiplier $224_2$ is applied to an input port of modulo-two summer $226_2$, and the summed output from modulo-two summer $226_2$ is applied to an input port of a modulo-two summer $226_3$, together with the output from multiplier $224_3$. Near the right end of the RSC encoder, modulo-two summer $226_{m-1}$ receives at its first input port the output from the (m−2nd) modulo-two summer, and adds to that sum the product from the output port of multiplier $224_{m-1}$. The resulting sum is applied from the output port of modulo-two summer $226_{m-1}$ to an input port of modulo-two summer $226_m$ which also receives the product signal from multiplier $224_m$. The summed output signal from modulo-two summer $226_m$ is an output of RSC encoder 216, and is manifested at output port 216o2.

Feedback network 228 of RSC encoder 216 of FIG. 2 includes a multiplier $230_1$ of a set 230 of multipliers, which has one input port coupled to the output port of register $220_1$. Similarly, multipliers $230_2, 230_3, \ldots, 230_{m-1}, 230_m$, of set 230 of multipliers each has its input port coupled to an output port of registers $220_2, 220_3, \ldots, 220_{m-1}$, and $220_m$, respectively. The output ports of each multiplier $230_1, 230_2, 230_3, \ldots, 230_{m-1}$, and $230_m$ are coupled to input ports of associated modulo-two summers $232_1, 230_2, 230_3, \ldots, 230_{m-1}$, and $230_m$, respectively. Each multiplier $230_1$ through $230_m$ receives at its second input port one bit of a multibit word "d", which acts as a multiplier. More particularly, multiplier $230_1$ receives a bit denominated d1 at its second input port, multiplier $230_2$ receives a bit denominated d2 at its second input port, multiplier $230_3$ receives a bit denominated d3 at its second input port, . . . , multiplier $230_{m-1}$ receives a bit denominated d(m−1) at its second input port, and multiplier $230_m$ receives a bit denominated d(m) at its second input port. Each multiplier multiplies the signal applied to its first input port by the digit applied to its second input port, to produce a product signal. The summed output signal from modulo-two summer $232_m$ is applied to a second input port of modulo-two summer $232_{m-1}$, . . . , the summed output signal from modulo-two summer $232_{m-1}$ is applied to an input port of the next lower-index modulo-two summer, . . . , the cumulative sum of all the higher-index modulo-two summers is applied to an input port of modulo-two summer $232_3$, which adds the multiplied value from multiplier $230_3$ to the cumulative sum, and applies its cumulated output signal to an input port of modulo-two summer $232_2$. Modulo-two summer $232_2$ adds to the input cumulated sum arriving from modulo-two summer $232_3$ the product from multiplier $230_2$, to produce a further cumulated output signal. The cumulated output signal from modulo-two summer $232_2$ is applied to a modulo-two summer $232_1$, which completes the sum by applying the cumulated total to an input port of modulo-two summer 218 and, by way of terminal $213_2$ and movable element 213m of switch 213, to summing circuit 214.

It will be apparent to those skilled in the art that, if a single pair of encoding words (n and d) is used exclusively, those branches of the feedforward network 222 and of the feedback network 228 in which the multiplier code bits are zero are branches in which there is multiplication by zero, so the branch always produces zero output, and the associated multiplier (and possibly adder) can be dispensed with. Similarly, in those branches in which the multiplier code word is a ONE, the signal at the other input port of the multiplier goes straight through the multiplier without change, in which case the multiplier is superfluous and may be dispensed with. Consequently, the illustrated embodiment is for the case of a changeable encoding (that is to say, for the case of selectably different words n and d), but the modifications for a fixed encoding version will be readily understood therefrom.

So far not described in FIG. 2 is switch array 234. Switch array 234 includes m switches designated $234_1, 234_2, 234_3, \ldots, 234_{m-1}$, and $234_m$, each of which connects one of the m stages of shift register 210 to a corresponding one of the registers of set 220. More particularly, switch $234_1$ of switch array 234 controllably couples shift register stage 210d1 to register $220_1$, switch $234_2$ of switch array 234 controllably couples shift register stage 210d2 to register $220_2$, switch $234_3$ of switch array 234 controllably couples shift register stage 210d3 to register $220_3$, . . . , switch $234_{m-1}$ of switch array 234 controllably couples shift register stage 210d(m−1) to register $220_{m-1}$, and switch $234_m$ of switch array 234 controllably couples shift register stage 210d(m) to register $220_m$, all under control of controller 208. The signals or bits stored in shift register stages 210, when coupled by closed or conductive paths through switch array 234 to the registers of set 220, reset each of the registers of set 220 to the value then stored in the corresponding shift register of set 210, thereby overwriting whatever information may have previously been stored in the registers of set 220.

The output sum from modulo-two summer $226_m$ of set 226 of RSC encoder 216 which appears at output port 216o2 is applied to a puncture processor 236. Puncture processor 236 "punctures" or reduces the number of signal samples, to compensate for the samples added in error correction/detection encoder 16, or to reduce the data rate represented by the encoded data to a data rate near the data rate for which the transmission path 18 is rated. The punctured parity signals from puncture processor 236 and the systematic portion of the signals appearing at port 216o1 are combined to form the output signal at output port 16o.

In operation of the error correction/detection encoder 16 of FIG. 2, a continuous stream of samples is applied to port 16i. Controller 208 groups the continuous input stream into frames of 70 samples by the way it controls the various portions of the processor. Thus, in a particular embodiment of the invention, controller 208 operates on a recurrent cycle of 70 input samples. At the beginning of each frame interval, controller 208 sets the movable elements 212m and 213m of switches 212 and 213 to their alternate positions (not illustrated), with the movable elements 212m and 213m connected to switch terminals $212_2$ and $213_2$, respectively. With these switch connections, the input signal samples applied to input port 16$i$ are routed to shift register 210, and the first eight samples are shifted through the elements of the shift register. At the same time that the current first eight samples are being loaded into the shift register 210, the eight samples which were the first samples loaded into the shift register during the previous frame are read from output port 210$o$, and applied by way of switch 212 (with its movable element 212$m$ in the upward position, contacting terminal $212_2$) to an input port $214_{i2}$ of summing circuit 214. At the end of the eighth sample transfer into shift register 210, controller 208 stops the clocking of shift register 208, and operates the switches of set 234 of switches to set the contents of the registers of set 220 to correspond to the then-current contents of the associated shift registers of set 210. More particularly, the contents of shift register 210$d$1 is loaded into or replicated into register $220_1$, the contents of shift register 210$d$2 is loaded into or replicated into register $220_2$, the contents of shift register 210$d$3 is loaded into or replicated into register $220_3$, . . . , the contents of shift register 210$d$(m−1) is loaded into or replicated into register $220_{m-1}$, and the contents of shift register 210$d$(m) is loaded into or replicated into register $220_m$. This loading of the registers of set 220 deletes all data from previous frames, and leaves the registers loaded with the first eight (in this particular embodiment) speech samples.

Before the arrival of the ninth speech sample at port 16$i$, the positions of switches 212, 213, and 234 are controlled to the illustrated state, namely the state in which movable elements 212$m$ and 213$m$ are coupled to terminals $212_1$ and $213_1$, respectively, and in which the contents of shift register 210 do not directly reset the states of the registers of set 220. The ninth speech signal samples in each "frame," and all succeeding speech signal samples in the current frame, are routed through switch 212 to an input port $214_{i1}$ of modulo-two summer 214, which, because switch element 213$m$ is coupled to a logic ZERO, does not modify the signal in response to the feedback signal from feedback system 228, but instead routes the signal, unmodified, directly, by way of a path including 238, to systematic output port 216$o$1 of port 16$o$. The signal from the output port of modulo-two summer 214 is also applied to the input port of modulo-two summer 218, where the signal is modified by feedback, and the feedback-modified signal at the output port of modulo-two summer 218 is applied to multiplier $224_0$ of the feedforward path, and to register $220_1$. The arrangement of feedback and feedforward paths associated with set of registers 220 of RSC encoder 216 produces at output port 216$o$2 one parity bit for each systematic bit appearing at port 216$o$1.

As so far described in the operation of the arrangement of FIG. 2, eight bits were applied to shift register 210, and the contents of the shift registers were loaded into the registers of set 220. The switches were thrown, and the next 62 bits were applied through the RSC encoder 216 to output port 216$o$1. During these same 62 bit intervals, the register set 220, together with its feedforward and feedback, produces another 62 bits at output port 216$o$2. At the end of the total count of 70 samples, then, only 62 samples have appeared at the output of the RSC encoder. At the end of the total count of 70 samples, controller 208 again throws switches 212 and 213 to their alternate positions, and clocks the first eight samples of the next frame into shift register 210. This causes the first eight samples from the previous frame to be clocked out of shift register 210, through switch 212, and to summer 214, where the signal is modified by feedback. The feedback-modified signal is routed by way of path 238 to output port 216$o$1, thus adding eight more samples to the 62 samples previously processed. Meanwhile, the parity bits are being generated in RSC encoder 216, to bring the parity bit total up to the 70 bits per frame. The parity bit is the redundant information, which is generated at a rate of one bit of parity for each bit of processed signal. Thus, in the illustrated example, the total number of bits appearing at output port 216$o$1 during each frame interval is 70 bits, and 70 more bits appear at output port 216$o$2.

Some of the parity samples are punctured in processor 236 to reduce the bandwidth of the signal to a level which corresponds to the bandwidth of the limited-bandwidth channel through which the coded signal will be transmitted. In this particular embodiment of the invention, 20 of the 70 parity samples are deleted by puncturing, so that the total number of samples at error correction/detection encoder 16 output port 16$i$ becomes the sum of 70 systematic samples plus 50 parity samples.

Figure 3:
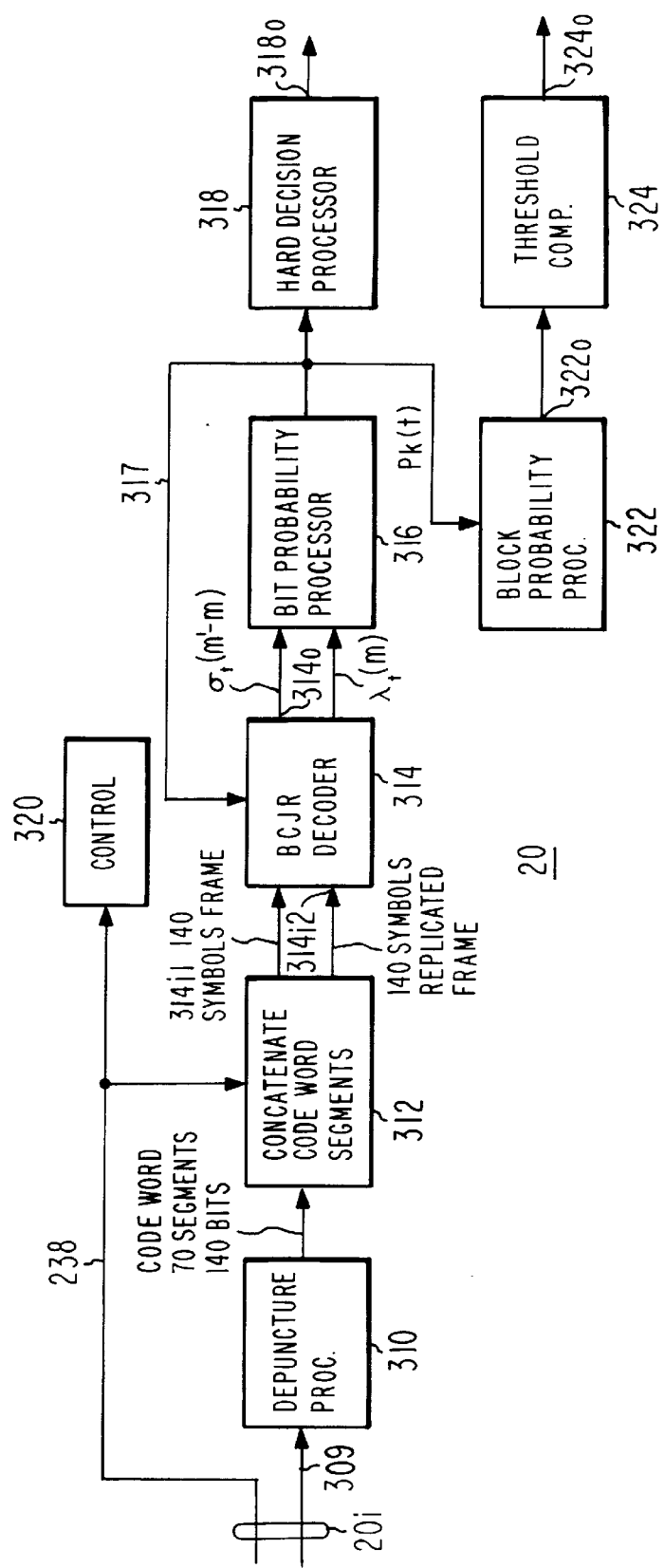
FIG. 3 is a simplified block diagram of a receiver including a coded signal decoder.

FIG. 3 is a simplified block diagram illustrating some details of error correction/detection decoder 20 of FIG. 1. In FIG. 3, bits which have traversed noisy channel 18 of FIG. 1 are applied by way of input port 20$i$ of decoder 20 to a demultiplexer 19, which demultiplexes the single transmission path into two separate transmission paths corresponding to the two paths of port 16$o$ of FIG. 2. From demultiplexer 19 of FIG. 1, the two signal paths enter port 20$i$ of error correction processor 20 of FIG. 3. The systematic bits are applied by way of path 238 to a control block 320 and to a concatenator block 312. The parity bits are applied by way of a path 309 to a depuncture processor 310, which reinserts bits into the data stream to fill those parity bit locations which were vacated by puncture processor 236 of FIG. 2. The inserted bits have a neutral value, such as a value of 0.5. It should be emphasized that these parity bit locations are not vacant as the signal arrives at decoder 20, but rather the bit locations themselves were eliminated, so that the replacements for the punctured parity bits must be reinserted between mutually adjacent bits of the received data stream. Operation of the depuncture processor 310 in the particular embodiment of the invention replaces the 20 parity bits, to create frames of codewords having 70 systematic bits and 70 parity bits, for a total of 140 bits per frame, which are intended to be equivalent or identical to the signal at outputs 216$o$1 and 216$o$2 of RSC encoder 216 of FIG. 2.

Depuncture processor 310, and other portions of decoder 20 of FIG. 3, are controlled by controller block 320. Controller 320 must ultimately be synchronized with the frames of incoming encoded signals. In the case of burst communications, synchronization must be acquired before the signals can be received, and whatever processor performs the burst synchronization can also provide synchronization to controller 320. In the case of continuous communication, all controller 320 has to do after initial synchronization is to count bits, and use its knowledge of the frame structure to keep track of the identity of the bits currently being processed.

The depunctured signals at the output of depuncture processor 310 of FIG. 3 are applied to concatenator block 312, which also receives the systematic bits from path 238. Concatenator block 312 replicates the 70 parity bits from depuncture processor 310 and the 70 systematic bits in each 140-bit frame, concatenates the original 140-bit frame with the replicated 140-bit frame, to thereby produce two 140-bit frames, each on a separate signal path. The output of demultiplexer and concatenator 312 is applied to an input port 314$i$ of a Bahl, Cocke, Jelinek, Raviv (BCJR) block decoder 314. BCJR decoders are known in the art, and are described generally in L. R. Bahl, J Cocke, F. Jelinek, and J. Raviv, OPTIMAL DECODING OF LINEAR CODES FOR MINIMIZING SYMBOL ERROR RATE, IEEE Transactions on Information Theory, Vol 20, pp 248–287, March 1978.

BCJR decoder 314 decodes the systematic and parity bits applied from demultiplexer and concatenator 312, using the same codewords (n and d) which were used for encoding in RSC encoder 216 of FIG. 2. This processing in block 314 "reverses" the operation performed by RSC encoder 216 of FIG. 2. More particularly, block 314 produces two values for each input bit. The value $\lambda_t(m)$ represents the probability that at any time t, the value of the current state is m, and $\sigma_t(m', m)$ represents the probability that at a time t, the state of the encoder has changed from m' to m. The value of the current bit, in turn, depends upon the state of RSC encoder 216 of FIG. 2 at the time the bit was generated, but before it traversed the noisy channel 18 of FIG. 1. Consequently, the probability value $\lambda_t(m)$ represents the probability that the RSC encoder "had" a state of m at the time t that the current bit was generated, and the probability value $\sigma_t(m', m)$ represents the probability that the RSC encoder 216 changed state at the time t. Thus, the subscript t in the probability value represents a bit index, and the value of m represents a state index.

In a particular embodiment of the invention, the RSC encoder 216 of FIG. 2 had 256 possible states. Thus, for each bit traversing the RSC encoder 216, there are 256$\lambda$ values or probabilities that the encoder has a particular state, and there are 512$\sigma$ values. Thus, each of the 140 bits of each frame is associated with a total of 728 probability values.

The probablities $\lambda_t(m)$ and $\sigma_t(m',m)$ are applied from block 314 to a block 316, which represents a bit probability processor, which generates the probability that the bit t, where t can range from 0 to 140 in each frame, is given by $P_K(t)$, where K represents the number of possible states which the bit can take, which in the case of a binary digit has the value two.

$$P_K 1(t) = \sum_{x|(m',m)=K} \sigma_t(m', m) \qquad (1)$$

for t=(m+1), . . . , N, where N=70 in the example, and in which the sum is taken for all those values of x, which are either a logic Zero or logic ONE, and are not indeterminate, which can cause a transition of the state of encoder 216 from m' to m. In other words, equation 1 is a summation over a subset of all the $\sigma_t$s for which the subscripted condition holds. For example, in the described system, which has eight stages of registers 220 in RSC encoder 216, there are $2^8$=256 possible states. When encoder 216 is in one possible state m', many of the states cannot be reached by application of a ONE or a ZERO to the input of encoder 216, and these states require an indeterminate input signal, or have a probability near zero. On the other hand, there are two possible states to which encoder 216 may make a transition upon application of either a ONE or a ZERO to the input of the encoder.

The value of $P_K(t)$ is determined in block 316 for different values of t, namely for t=(1, . . . , M), according to $$P_k 2(t) = \sum_{S|s_t=k} \lambda_0(S) \qquad (2)$$

which represents a summation over all state probabilities having time index zero (from among all the state probabilities, including other time indices, which may be applied to the input of block 316 of FIG. 3), such that the $t^{th}$ bit of the state label S equals K. The state label S={$S_1$, $S_2$, $S_3$, . . . , $S_t$, . . . $S_{m-1}$, $S_m$}, corresponding to the states of the registers of register set 220 of FIG. 2.

The output of block 316 of FIG. 3 at output port 314o represents the probability, for each of the original input bits (the bits originally applied to input port 16i of error correction/detection encoder 16 of FIG. 1, that the bit takes on a particular logic level. As one example, when the 70 bits per frame are originally applied to encoder 16 of FIG. 1, bit probability processor 316 of FIG. 3 produces two probabilities for each of the 70 bits under consideration, one probability that the bit is a logic ONE, and one probability that the bit is a logic ZERO. Ideally, these probabilities should total 100% for each bit. That is to say, for any one bit, if the probability of its being a logic ONE is 80%, the probability of its being a logic ZERO should be 20%. These totals may not total 100% because of rounding, approximations, and the simplification of implementations or computations from the theoretical ideal.

Hard-decision processor 318 of FIG. 3 receives the probabilities from processor block 316, and simply picks the larger probability of each pair to identify the value of the bit being considered. Thus, for any bit, if the probability of its being a logic ONE is 65% and the probability of its being a logic ZERO is 4%, the hard. decision is that the bit is a logic ONE, based upon 65% being larger than 4%. In the event that the two probabilities are equal, such as 40% and 40%, an arbitrary (but invariant) value is selected. In other words, if the probabilities are equal, the processing in one embodiment of block 318 always produces a logic ONE. The hard-decided bits are produced at output port 318o of block 318.

Block probability processor 322 of FIG. 3 receives the bit probabilities from processor 316, and computes block probabilities BPE according to $$BPE = \prod_{t=1}^{t=tmax} \max[P_0(t), P_1(t)] \qquad 3$$

which represents a multiplication or product over the block length (70 bits in the example), of the larger of the two probabilities. The block probability represents the likelihood that there is not an error in the hard decisions of the block or frame. Since information is being used in block 322 which has already been determined in block 318, it is convenient to combine blocks 318 and 322 into an interconnected function.

The output of block probability processor 322 at port 322o is applied to a threshold comparator block 324, which compares the BPE against a set threshold, to thereby provide a flag at output port 324o which indicates the presence or absence of error in decoding the frame or block of data bits. The decided bits and the frame error flag are applied from error correction decoder 20 of FIG. 1 to the speech synthesizer 22. The decided bits are used in the ordinary manner for reconstituting speech signals, and the flag is to invoke the concealment algorithms in the speech synthesizer.

In accordance with an aspect of the invention, BCJR decoder 314 of FIG. 3 uses both absolute and joint vocoder statistics, available in the form of tables generated, as described above, by statistical examination of the vocoder outputs with different speakers and sentences.

It should be understood that the statistics will vary, depending upon the gender of the speaker, individual physiological difference, and also depending upon accents and the language being spoken. Further, it should be understood that the statistics depend upon the particular configuration of the vocoder itself (where the word "configuration" relates to the configurations of the electrical "boxes" and their interconnections, rather than to physical morphology).

Figure 4:
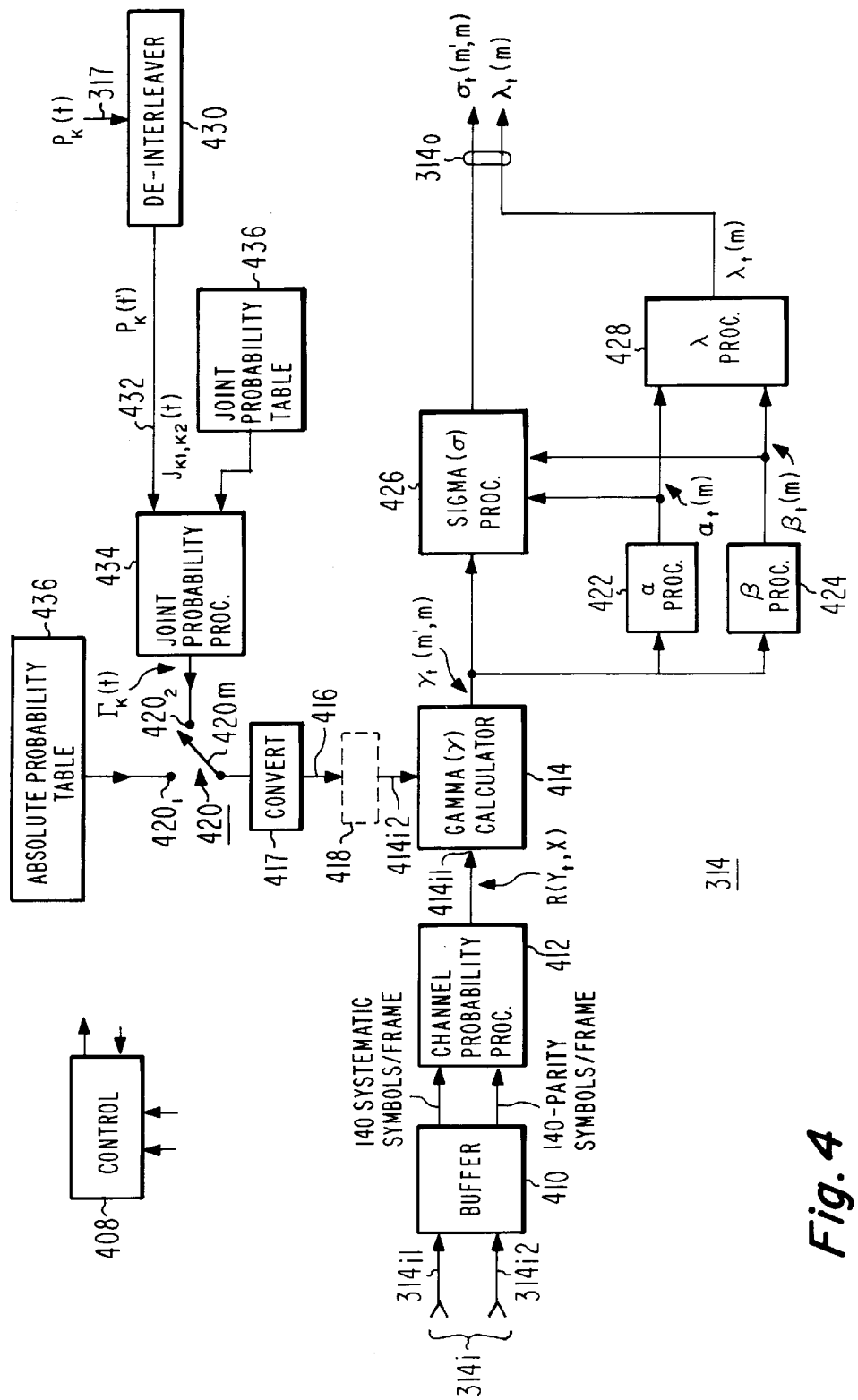
FIG. 4 is a simplified block diagram illustrating details of the decoder of FIG. 4.

FIG. 4 is a simplified block diagram of BCJR decoder 314 of FIG. 3. In FIG. 4, a sequence of 140-bit frames, each including 70 systematic symbols concatenated with 70 systematic symbols, is applied over signal path 314i1 of input port 314i of BCJR decoder 314 to an input port of a buffer 412. Similarly, a sequence of 140-bit frames, each including 70 parity symbols concatenated with 70 parity symbols, is applied over signal path 314i2 of input port 314i of BCJR decoder 314 to an input port of buffer or temporary memory 412. The buffered signals are applied to a channel probability processor 412, which calculates a joint probability $R(Y_t, x)$, which is the probability that $Y_t$ is an output of the channel, given that x is the symbol input to the channel. A description of how to calculate the value is given in the Bahl et al. article. The $R(Y_t,x)$ output of block 412 is applied to a first input port 414i1 of a gamma calculation block 414, which calculates gamma with the aid of a source probability distribution signal ($q_t$) applied to its second input port 414i2.

As described in the abovementioned Bahl et al. article, the source probability distribution code has the fixed value of 0.5. This is because there is no preference for any given bit, and because is no correlation between the value of a given source bit and the value of the next following source bit. In FIG. 4, dashed-line block 418 represents the source of a fixed value of probability distribution code as suggested by Bahl et al. According to an aspect of the invention, in those cases in which such a preference or correlation exists, the gamma is calculated in a different manner.

In the arrangement according to an aspect of the invention, illustrated in FIG. 4, gamma is calculated as $$\gamma_t(m', m) = \sum_X p_t(m \mid m') \cdot q_t(X \mid m', m) \cdot R(Y_t, X) \quad 4$$

where:
the pipe symbol | represents the concept of "given that" in probability;
$p_t(m|m')$ represents the actual probability that the encoder made a state transition from m' to m upon the application of the data bit to the encoder, rather than the more general Markov transition probabilities envisioned by the Bahl et al. paper;
$q_t(X|m',m)$ represents the systematic and parity output bits of the encoder given that the state change from m' to m occurred in the encoder upon application of the data bit to the encoder.

With a binary RSC encoder (216 of FIG. 2), a transition from state m' to state m specifies one particular value of X, hence (a) the summation occurs over only one value, and there is no need to perform the summation, nor even an addition, after determining the products, and (b) the value $q_t(X|m',m)$ has a value of unity. The exact meaning of the gamma signals $\gamma_t(m',m)$ can be understood by referring to the Bahl et al. paper, but it may be viewed an intermediary step required in determining the alpha, beta, and sigma signals, discussed below.

The gamma signals $\gamma_t(m',m)$ generated by gamma calculator block 414 of FIG. 3 are applied to input ports of an alpha ($\alpha$) processor 422, a beta ($\beta$) processor 424, and a sigma ($\sigma$) processor 426. Alpha processor 422 calculates $\alpha_t(m)$ as $$\alpha_t(m) = \sum_{m'} \alpha_{t-1}(m') \cdot \gamma_t(m', m) \quad 5$$

where $\alpha_t$ depends upon $\alpha_{t-1}$, so the initial recursion is formally indeterminate, but the boundary conditions are set $\alpha_0(m)=1/m$ to eliminate this problem. The summation of equation 5 extends over all states of the RSC encoder for which the transition from state m' to state m has non-zero probability, but even if the summation of equation (5) were to include states in addition to those having non-zero probability, the equation would give the same result, because of the values taken by $p_t(m|m')$, which provides a zero-amplitude multiplier in those cases. The $\alpha_t(m)$ output signal from alpha processor 422 represents the forward or anticipatory state probabilities (established with partial information extending from the present to the "beginning of time," or back to the beginning of the current frame in the present context).

Beta processor 422 calculates $\beta_t(m)$ as $$\beta_t(m) = \sum_{m'} \beta_{t+1}(m') \cdot \gamma_{t+1}(m, m') \quad 6$$

where $\beta_t$ depends upon $\beta_{t+1}$, so the initial recursion is formally indeterminate, but the boundary conditions are set $\beta_{tmax}(m)=1/m$ to eliminate this problem. The summation of equation 5 extends over all states of the RSC encoder for which the transition from state m to state m' has non-zero probability, but even if the summation of equation (6) were to include states in addition to those having non-zero probability, the equation would give the same result, because of the values taken by $p_t(m|m')$, which provides a zero-amplitude multiplier in those cases. The $\beta_t(m)$ output signal from beta processor 422 represents the backward state probabilities (established with partial information extending from the present to the "end of time," or forward to the end of the current frame in the present context).

Sigma processor 426 calculates transition probabilities $\sigma_t(m',m)$ as $$\sigma_t(m',m) = \alpha_{t-1}(m') \cdot \gamma_t(m',m) \cdot \beta_t(m) \quad 7$$

where $\sigma_t(m',m)$ is produced at output port 426o of block 426, and is applied to a signal path of port 314o. Output signal $\sigma_t(m',m)$ of block 426 represents the probability of a state transition of the RSC encoder from state m' to state m at bit index t.

Lambda processor 428 of FIG. 4 receives the $\alpha_t(m)$ signals from block 422 and the $\beta_t(m)$ signals from block 424, and produces $\gamma_t(m)$ signals, which are applied over a signal path of output port 314o.

As described in conjunction with FIG. 3, the $\sigma_t(m',m)$ and the $\gamma_t(m)$ signals outputted from port 314o are coupled to bit probability processor 316 of FIG. 3, which generates bit probability signals $P_K(t)$. Bit probability signals $P_K(t)$ represent the probabilities that any bit takes on a particular logic state, as described above. As illustrated in FIG. 3, the $P_K(t)$ signals are fed back from the output of block 316, by way of a signal path 317, to block decoder block 314. Referring to FIG. 4, the $P_K(t)$ enter by way of signal path 317, and are coupled to a "renumbering" block 430. Renumbering block 430 matches the $P_K(t)$ with the other bits in the frame with which the $P_K(t)$s are presumably correlated. This is accomplished by simply re-indexing the bits in the two 35-bit frames making up the 70-bit frame, redesignating bits 36–70 as 1–35, respectively, and redesignating bits 1–35 as 36–70, thereby generating signals designated $P_K(t')$. The renumbered probability signals $P_K(t')$ are applied over a signal path 432 to a block 434, which also receives the appropriate joint probability signals $J_{k1,k2}(t)$ for the symbol under consideration, from a look-up table 436 of joint probability values, all under control of a decoder control illustrated as a block 408. The value of $J_{k1,k2}(t)$ is given by $$J_{k1,k2}(t)=Pr(d_n(t)=K1|d_{n-1}(t)=K2) \quad (8)$$

which can be read as "The probability that the data in frame n at bit index t is equal to K1 given that the data of frame index (n−1) at bit index t was equal to K2." For each frame, there are 35 "t's", there are two "K1"s per bit, and there are two "K2"s per bit, so there are a total of 140 probabilities in the joint probability table 436.

Block 434 represents a joint probability processor, which receives the renumbered probability signals $P_K(t')$ from block 430 and the joint probability information $J_{k1,k2}(t)$ from table 436, and determines the actual probability value $\Gamma_K(t)$ which should be applied in generating the value of gamma γ in block 414, in accordance with $$\Gamma_K(t)=[P_0(t')J_{K,0}(t)]+[P_1(t')J_{K,1}(t)] \quad (9)$$

which can be read as "The actual probability value under the hypothesis that the bit is equal to K at the bit index t equals the product of the zero bit probability estimate multiplied by the respective joint probability, plus the product of the one bit probability estimate multiplied by it's respective joint probability."

The absolute probability table is a table of values $A_K(t)$ determined by $$A_K(t)=Pr(d(t)=K)$$

which can be read as "The absolute probability that the bit is equal to K at bit index t is equal to the probability that the data at bit index t is equal to K."

Switch 420 is illustrated in FIG. 4 by a mechanical switch symbol, including a movable common element 420m and terminals $420_1$ and $420_2$. Common element 420m couples to source probability distribution input port 414i2 of gamma calculation block 414 either (a) the absolute probability signals $A_K(t)$ applied from table 436 to switch terminal $420_1$ or (b) the joint probability signals $J_{k1,k2}(t)$ applied from block 434 to switch terminal $420_2$. In this regard, the signals from common movable switch element 420 to gamma calculator 414 substitute for the fixed value provided in the prior art by the block illustrated as 416. Thus, in the context in which there is correlation between corresponding bits of consecutive frames, or in which the absolute probabilities of the various bits differ, the actual joint or absolute statistics are used in calculating gamma.

According to the invention, the value of $p_t(m|m')$ in equation (4) is determined by that source statistic (either absolute or joint) which is routed to input port 414i2 of block 414 by switch 420. However, value of $p_t(m|m')$ is a transition probability, and the source statistics are bit probabilities, so the source statistics must be converted within block 414 into transition probabilities for use in equation (4). The conversion is accomplished in block 417, which receives the source statistics, and performs the following selections $$P_t(m|m')=S_0(t) \text{ when } (d|m',m)=0 \quad (10)$$

$$P_t(m|m')=S_1(t) \text{ when } (d|m',m)=1 \quad (11)$$

$$P_t(m|m')=0 \text{ when } (d|m',m) \text{ is indefinite} \quad (12)$$

The selected values are applied to input port 414i2 of gamma calculation block 414.

So far, the control of switch 420 has not been described. As mentioned above, block 410 of FIG. 4 receives a frame or block of data, in which the systematic symbols and the parity symbols are stored in replicated form. Operation of the decoder 314 of FIG. 4 is controlled to decode a set of 140 systematic symbols together with a set of 140 parity symbols, with switch 420 set to couple the absolute source statistics from table 436 to gamma calculator 414, following which the same set of 140 systematic symbols together with the associated 140 parity symbols are again processed through decoder 314, this time with the switch 420 set to couple the joint statistics from processor 434 to gamma calculation block 414. This results in generation of two sets of data at output port 314o of decoder 314, of which the first is an interim solution based on intermediate hard decisions. The second solution provides hard decisions, in which the reliability of the hard decision is improved by the use of the interim hard decision to aid in the final decision.

Figure 5:
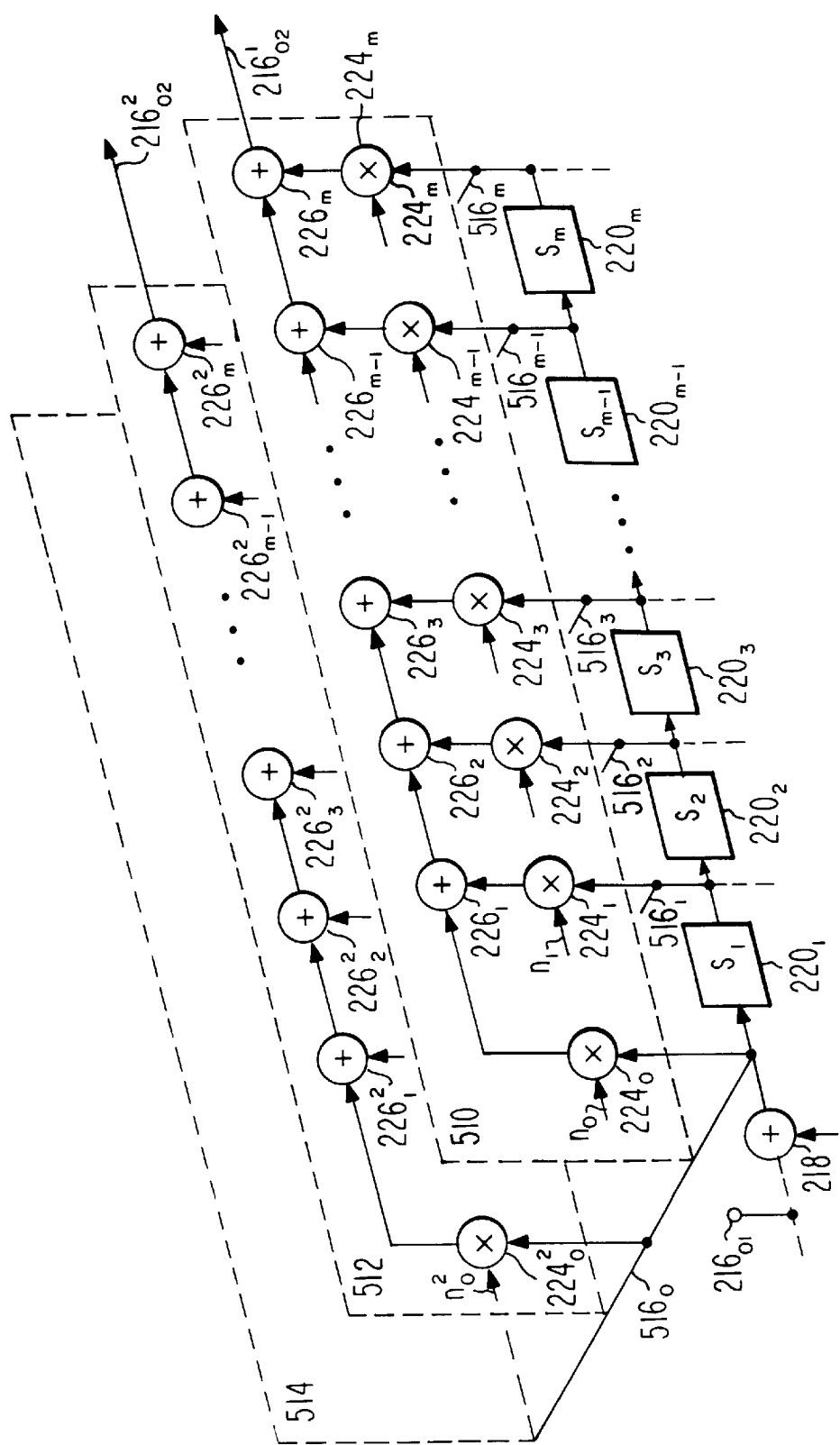
FIG. 5 is a simplified diagram illustrating a portion of the arrangement of FIG. 2 for a rate ⅓ encoder.

The arrangement of FIG. 2 may be termed a "rate ½" encoder. FIG. 5 illustrates a portion of the arrangement of FIG. 4 illustrating changes which make a rate ⅓ encoder, and generally other rate encoders. Those portions of the encoder of FIG. 2 which appear in FIG. 5 are identified by like reference numerals. In FIG. 5, elements $224_0$, $224_1$, $224_2$, $224_3$, ..., $224_{(m-1)}$, $224_{(m)}$, $226_1$, $226_2$, $226_3$, ..., $226_{(m-1)}$, and $226_{(m)}$ are illustrated as being mounted on a conceptual "board" designated 510. A similar "board" 512 is illustrated as being arrayed with board 510. While only a portion of the elements mounted on board 512 are illustrated, the elements are identical to those of board 510. As suggested by the connecting lines $516_0$, $516_1$, $516_3$, ..., $516_{(m-1)}$, $516_{(m)}$, the "boards" 510 and 512 are interconnected with each other and with the various stages $S_1$, $S_2$, $S_3$, , ..., $S_{(m-1)}$, and $S_{(m)}$ so that feedback or feedforward occurs in parallel, to thereby define a rate ⅓ encoder. In FIG. 5, a further "board" 514 suggests that additional boards, providing additional parallel paths for feedforward or feedback, may be used for other encoder rates.

Thus, the invention provides improved decoding of the coded signal, by using correlation information which is not transmitted over the narrowband data channel. The particular information which aids in decoding is the joint statistics relating the value of a bit to that of the adjacent bit. The table of information is provided to the receiver by a floppy disk, or is prestored in memory in the receiver.

Other embodiments of the invention will be apparent to those skilled in the art. For example, while switches have for simplicity been described as though they were mechanical, those skilled in the art know that mechanical switches or relays are slow in operation, bulky, heavy and unreliable by comparison with equivalent electronic switches, which should be used instead. While some signal paths are described andor illustrated as parallel paths, and others as single paths, this is simplification for clarity of explanation, and those skilled in the art know that the same data can be propagated over parallel or single paths somewhat indiscriminately so long as the data rates are adequate and proper buffering is provided, as required. While the description of the invention has been in the form of interconnected "blocks," those skilled in the art know that software-controlled processors may be used for any or all portions of the system, or hardware can be used which approximates the illustrated blocks. In a preferred embodiment of the invention, a software-controlled processor is used.

What is claimed is:

1. A method for generating, in a $2^M$ state M-register encoder including a common input-output port, at least a second output port, and multistage feedback, from source information organized into N-bit frames, a code word of a recursive systematic code, said method comprising the steps of:

storing the first M bits of each frame of said source information to produce M stored bits;

loading said stored M bits into corresponding registers of said encoder;

encoding the remaining (N−M) bits of each of said frames by applying said (N−M) bits to said common input-output port of said encoder, whereby said encoder changes state with each succeeding bit applied to said common input-output port, systematically encoded information appears at said common input-output port of said encoder, and parity bits appear at said second output port of said encoder;

following said step of encoding the remaining (N−M) bits, summing said M stored bits with a feedback signal to generate an M-bit intermediate signal, and applying said intermediate signal to said common input-output port in such a manner that the state of said encoder at the termination of encoding each frame is the same as the state of said encoder after said step of loading.

2. A method according to claim 1, wherein said encoder is a feedback rate ½ encoder.

3. A method according to claim 1, wherein said encoder is a feedback rate ⅓ encoder, and said encoder also includes a third output port.

4. A method for transmitting and decoding a codeword of a recursive systematic code produced in a $2^M$ state M-register encoder including a common input-output port, at least a second output port, and multistage feedback, from source information organized into N-bit frames, said transmitting method including the steps of: (a) storing the first M bits of each frame of said source information to produce M stored bits; (b) loading said stored M bits into corresponding registers of said encoder; (c) encoding the remaining (N−M) bits of each of said frames by applying said (N−M) bits to said common input-output port of said encoder, whereby said encoder changes state with each succeeding bit applied to said common input-output port, systematically encoded information appears at said common input-output port of said encoder, and parity bits appear at said second output port of said encoder; (d) following said step of encoding the remaining (N−M) bits, summing said M stored bits with a feedback signal to generate an M-bit intermediate signal, and applying said intermediate signal to said common input-output port in such a manner that the state of said encoder at the termination of encoding each frame is the same as the state of said encoder after said step of loading, said method for decoding comprising the steps of:

serially transmitting said systematic and parity bits over a data path, whereby noise may be introduced:

duplicating received systematic and parity bits;

applying BCJR algorithms to said duplicated systematic and parity bits, to thereby obtain $\sigma_t(m', m)$ and $\lambda_t(m)$, where $\lambda_t(m)$ represents a probability that at any time t, the value of the current state is m, and $\sigma_t(m', m)$ represents a probability that at a time t, the state of the encoder has changed from m' to m, where m' is the state of the encoder prior to state m;

processing said $\sigma_t(m', m)$ to obtain a first $P_K(t)$ according to $$P_K 1(t) = \sum_{x|(m',m)=K} \sigma_t(m', m)$$

for each bit in the range t=(M+1), ... N where K represents the number of possible state which the bit can take and X is either a logic ZERO or logic ONE, and is not indeterminate;

processing said $\lambda_t(m)$ to obtain a second $P_K(t)$ according to $$P_k 2(t) = \sum_{S|s_t=k} \lambda_0(S)$$

for each bit in the range t=1, ..., M where S is the state label;

for each bit in the range t=1, ..., N, selecting the bit value based upon the greater probability of the first $P_K(t)$ and the second $P_K(t)$ generated in said processing steps to thereby generate a hard decision for each bit.

* * * * *